(12) United States Patent
Wu et al.

(10) Patent No.: US 6,720,256 B1
(45) Date of Patent: Apr. 13, 2004

(54) METHOD OF DUAL DAMASCENE PATTERNING

(75) Inventors: Tsang-Jiuh Wu, Taichung (TW); Li-Te S. Lin, Hsin-Chu (TW); Li-Chih Chao, Yan-mei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/309,428

(22) Filed: Dec. 4, 2002

(51) Int. Cl.⁷ .......................................... H01L 21/4763
(52) U.S. Cl. ................ 438/638; 438/624; 438/636; 438/637
(58) Field of Search ................ 438/624, 636, 438/637, 638

(56) References Cited

U.S. PATENT DOCUMENTS

| | | | |
|---|---|---|---|
| 4,882,008 A | 11/1989 | Garza et al. ............. 156/643 |
| 5,286,607 A | 2/1994 | Brown ..................... 430/313 |
| 5,700,628 A | 12/1997 | Moslehi .................. 430/313 |
| 5,922,516 A | 7/1999 | Yu et al. ................. 430/314 |
| 6,080,678 A | 6/2000 | Yim ........................ 438/725 |
| 6,120,974 A | 9/2000 | Matsuo et al. .......... 430/314 |
| 6,319,809 B1 | 11/2001 | Chang et al. ........... 438/597 |
| 6,323,121 B1 * | 11/2001 | Liu et al. ................ 438/633 |
| 6,368,979 B1 * | 4/2002 | Wang et al. ............. 438/723 |
| 6,429,116 B1 * | 8/2002 | Wang et al. ............. 438/623 |
| 6,521,524 B1 * | 2/2003 | Wang et al. ............. 438/637 |
| 6,576,562 B2 * | 6/2003 | Ohuchi et al. .......... 438/725 |
| 6,593,659 B2 * | 7/2003 | Yokoyama .............. 257/774 |
| 6,605,545 B2 * | 8/2003 | Wang ..................... 438/717 |

\* cited by examiner

*Primary Examiner*—Richard Elms
*Assistant Examiner*—Christian D. Wilson
(74) *Attorney, Agent, or Firm*—George O. Saile; Steohen B. Ackerman

(57) ABSTRACT

An improved method of patterning photoresist during formation of damascene structures is provided which involves a process that is resistant to poisoning from adjacent layers. An inert resin is used to fill vias in a damascene stack. Then a second stack comprised of an underlayer, a non-photosensitive Si-containing layer, an ARC, and a photoresist are formed on the first stack. A trench pattern formed in the photoresist is etch transferred into the first stack. The Si-containing layer that is preferably a spin-on material can be optimized for thermal and etch resistance without compromising lithographic properties since it is not photosensitive. The state of the art photoresist provides a large process window for printing small features with no scum. The inert resin, underlayer, and silicon containing layers are independent of exposure wavelength and can be readily implemented into existing or future manufacturing schemes.

43 Claims, 8 Drawing Sheets

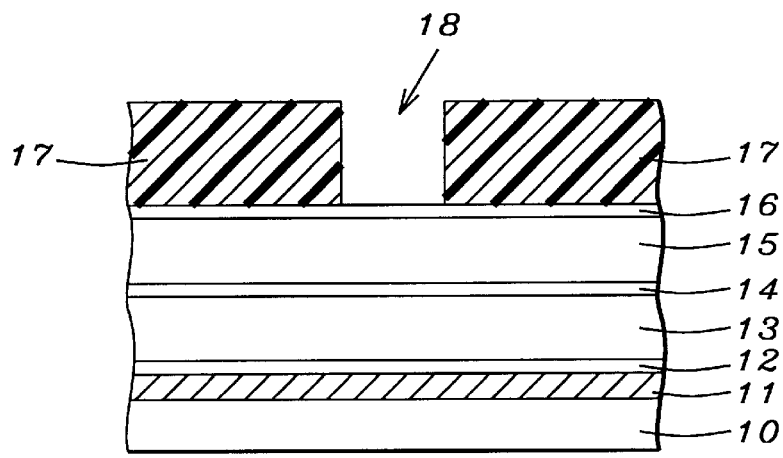
FIG. 1a – Prior Art
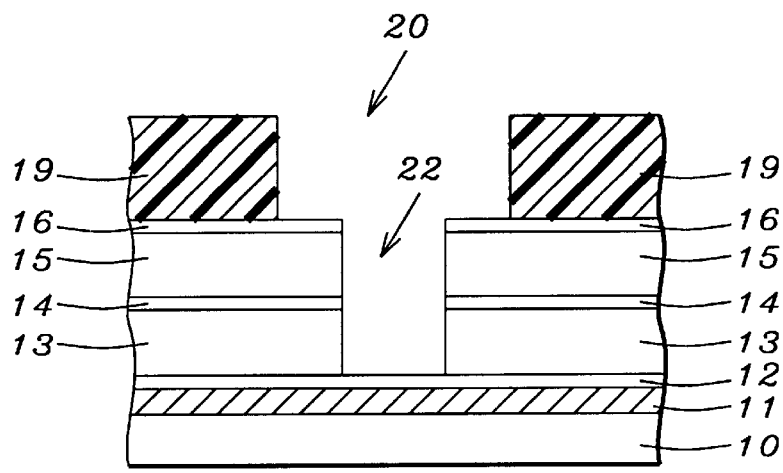
FIG. 1b – Prior Art
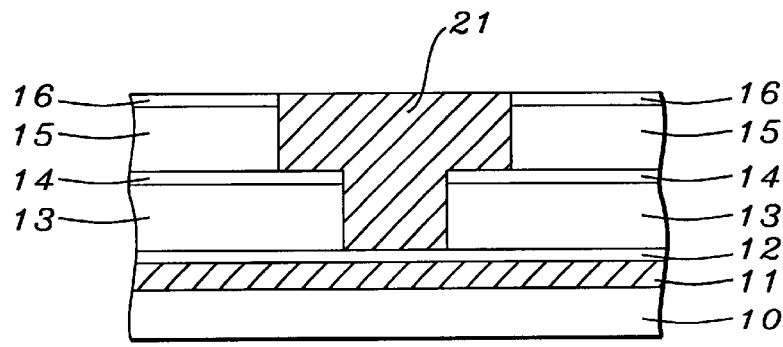
FIG. 1c – Prior Art

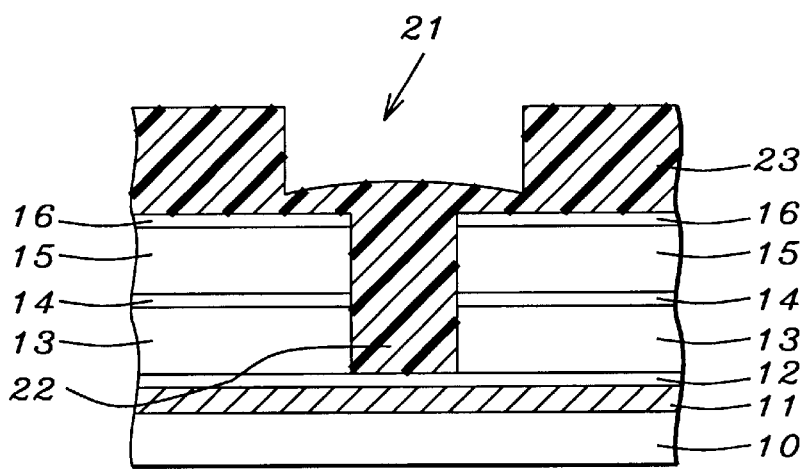
FIG. 2 – Prior Art
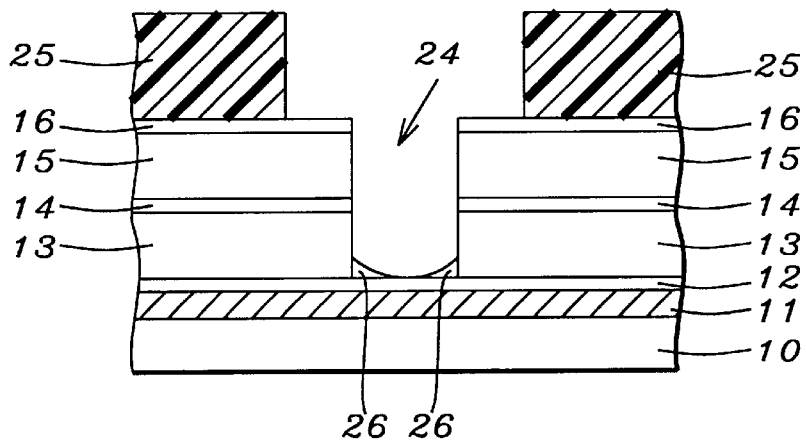
FIG. 3 – Prior Art
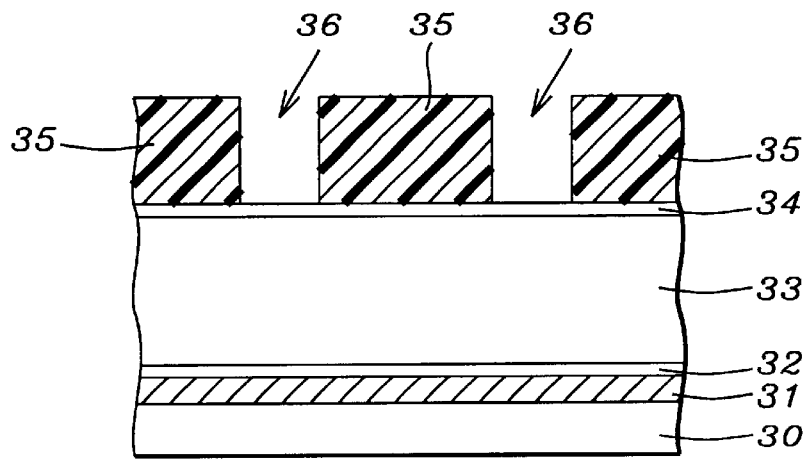
FIG. 4a

METHOD OF DUAL DAMASCENE PATTERNING

FIELD OF THE INVENTION

The invention relates to the field of fabricating integrated circuits and other electronic devices and in particular to an improved method of photoresist patterning that provides a wider process latitude and higher yield during the formation of dual damascene structures.

BACKGROUND OF THE INVENTION

The manufacture of integrated circuits involves a lithographic process to form a pattern in a photoresist layer and one or more etching steps to transfer each pattern into a substrate. While most photoresists are optimized for front end of the line (FEOL) applications that generally have smaller feature sizes or critical dimensions (CD) than back end of the line (BEOL) applications, BEOL processes have unique challenges that require special solutions in some cases. For example, when forming a damascene structure, the lithography process usually must contend with considerable topography and has to be compatible with dielectric materials that can poison the photoresist.

There is an ever present demand for smaller circuits in semiconductor devices in order to achieve higher performance. From a photoresist standpoint, a smaller CD in a feature that will become a circuit is more easily printed when the film thickness is reduced or when the exposure wavelength is decreased according to the equation $R=k\lambda/NA$. R is the minimum CD that can be resolved while k is a process constant, $\lambda$ is the exposure wavelength, and NA is the numerical aperture of the exposure tool. Thinner films help to lower k but in the example of a damascene process, the uneven surface of the substrate prevents a thin photoresist film from becoming planar. Film thickness non-uniformity leads to problems with controlling reflectivity off the substrate during exposure and as a result there is a wide variation in printed CD for each feature in the photoresist pattern. In addition, if photoresist fills the via part of the damascene structure, it is difficult to remove during the patterning step and residue or scum is often left behind that can increase cost due to rework and lower yield A bilayer concept has been introduced to overcome the difficulties associated with imaging a thin single layer of photoresist. Typically, the top layer in a bilayer scheme is a thin film of photoresist containing a small percentage of an element like silicon that can easily form an etch resistant oxide in an oxygen plasma. The bottom layer is thicker so that it can form a planar surface over topography and often contains highly absorbing material that minimizes reflectivity to improve top layer patterning. The bottom layer is usually not photosensitive but may be comprised of a crosslinkable component that reacts with a thermally generated acid. The resulting crosslinked layer tends to be more unreactive toward the solvent or other components of the top layer to avoid mixing of the two layers. In theory, the thin photosensitive layer on a planar underlayer should provide a path to forming small feature sizes with a good process latitude during patterning of the top layer. The silicon containing film provides a high selectivity for transferring a pattern through a thick underlayer during an oxygen etch.

However, a lack of maturity in silicon containing photoresist technology has prevented widespread acceptance of the bilayer concept in the industry. When the composition of the silicon containing photoresist is optimized to provide more silicon content for better etch selectivity, the imaging performance usually suffers. CD non-uniformity across the wafer is one particular problem that is observed when imaging immature bilayer photoresists.

In order to achieve finer resolution in patterns, the exposing wavelength ($\lambda$) has been steadily shifting lower in recent technology generations or nodes. For larger feature sizes from about 300 nm to about 1 micron, i-line (365 nm) or g-line (436 nm) exposure tools are more popular because of a lower cost of ownership. For the 130 nm to 250 nm nodes, Deep UV (248 nm) exposure tools are considered state of the art. Meanwhile, 193 nm exposure tools are thought to be the best solution for reaching the 100 nm node and a 157 nm technology is being developed for the 70 nm node.

With the shift to 248 nm and 193 nm exposure wavelengths, a new lithography concept was introduced in which photoresists operate by a chemical amplification (CA) mechanism whereby one molecule of strong acid is capable of causing hundreds of chemical reactions in an exposed film. A strong acid is generated by exposing a photosensitive component and the acid reacts with acid labile groups on a polymer in positive tone photoresist. In negative tone photoresist, the acid initiates a crosslinking reaction. Unfortunately, this new approach is quite sensitive to traces of base compounds such as airborne amines or amines that diffuse into the chemically amplified photoresist from an adjacent layer. Sometimes, amine concentrations as low as parts per billion (ppb) can inhibit or "poison" the CA reaction enough to prevent a pattern from being formed.

Another concern that has recently appeared for 193 nm and 248 nm applications is outgassing from silicon containing resists. High energy exposures are capable of breaking C—Si or O—Si bonds that can release volatile fragments of silicon containing material which can deposit on the lens component of the exposure system. Eventually, the deposit is converted to $SiO_2$ that forms a permanent coating and irreversibly damages the expensive optics.

An option in the bilayer approach is to expose a silicon free photoresist layer over an underlayer and then selectively introduce a silicon reagent into either the exposed or unexposed regions. This method of treating a photosensitive film with a silicon compound that reacts to become incorporated into the film is called silylation. In U.S. Pat. No. 5,922,516, the underlayer is a photoresist that has been thermally crosslinked at a temperature between 110° C. and 140° and a silicon compound in a vapor phase reacts with the top photoresist. This method appears to be limited to an underlayer which is a 365 nm or 436 nm sensitive material because Deep UV (248 nm) and 193 nm photoresists are typically high activation energy systems that are normally processed up to 150° C. without crosslinking. A lack of maturity in silylation tools is another concern for this technique.

A related bilayer method described in U.S. Pat. No. 5,286,607 involves silylation of the underlayer which is a photoresist and then patterning a second photoresist layer above the silylated material. Generally, silylation does not provide the same uniformity of silicon content across a film and into a film as when the coated layer already contains silicon. Moreover, an optimized bilayer system has the refractive index (RI) of the underlayer matched to the top layer so that the patterning process produces a vertical profile in the top layer. In other words, the sidewalls on the photoresist image form a straight line and do not have a foot at the interface with the underlayer. A foot is defined as a lateral extension from the base of a photoresist image where some photoresist remains on a substrate. When the (RI) of the two layers is not matched, a foot on the patterned image or photoresist residue on the underlayer tend to form which leads to problems in the subsequent etch transfer step. It is difficult to control the RI with a silylation technique because the composition as a function of depth is not uniform unlike the case with a film formed by spin coating a silicon containing material.

In another prior art example, U.S. Pat. No. 4,882,008 teaches how to perform a silylation and subsequent etch processes in the same chamber. However, the method does not deal with new challenges of photoresist poisoning by amines or with the unique challenges of patterning to form damascene structures.

U.S. Pat. No. 6,120,974 describes a novel polymer that forms an amine after a 193 nm patterned exposure and which forms a sulfonic acid following a second blanket exposure to neutralize the amine in first exposed regions. Regions that contain only sulfonic acid catalyze a reaction when a metal alkoxide is introduced and form a metal oxide which serves as an etch mask for the next step. Polymers with dual functionality are especially difficult to purify because traditional washing methods involving acid or base solutions will react with either the base precursor group or the acid precursor group. Small amounts of unreacted precursor polymer having acid or base groups can interfere with the precise compositional balance required to achieve a neutralization in double exposed regions and thereby cause unwanted oxide formation.

While some imaging methods have been proposed that bypass photoresist entirely such as in U.S. Pat. No. 5,700,628, they have not be accepted into manufacturing schemes as yet. In this case, 248 nm radiation is claimed to have a sufficient energy to break Si—F bonds in a fluorinated polysilicon substrate that is from 100 to 1000 Angstroms thick. However, the transparency of such a substrate is not high enough to allow light to penetrate very far below the surface and the exposure dose needed to break a sufficient number of Si—F bonds would be quite high such that the throughput is not compatible with a low cost process.

Although the underlayer with a thickness of about 5000 to 15000 Angstroms in a bilayer scheme can be used as an anti-reflective layer to absorb light that passes through the top layer, other anti-reflective coatings (ARCs) are commercially available and generally are used as a much thinner coating in the range of about 500 to 1000 Angstroms. These thin ARCs are employed when the substrate is relatively flat and have been tuned so that their RI matches a particular family of photoresists. For example, one type of ARC is available for i-line photoresists and another type has been developed for imaging Deep UV photoresists. Once the photoresist pattern is formed, it must be transferred with an etch process through the ARC. Usually, the etch selectivity is poor when a non-silicon containing imaging layer is the etch mask and corner rounding occurs as shown in U.S. Pat. No. 6,080,678. A new etch gas mixture including $O_2$ and $SO_2$ is claimed to provide less corner loss on the photoresist image.

A prior art method of forming a damascene structure is shown in FIGS. 1a–1c. In FIG. 1a, an opening 18 has been formed in photoresist 17 on a stack consisting of passivation layers 12 and 16, dielectric layers 13 and 15, etch stop layer 14, metal layer 11, and substrate 10. The opening 18 is etch transferred through underlying layers 13, 14, 15, and 16 to form a via hole 22. After photoresist 17 is stripped, a second photoresist 19 is coated and patterned to form a trench opening 20 in FIG. 1b. Opening 20 is etch transferred through passivation layer 16 and dielectric layer 15. Photoresist 19 is stripped and a metal layer 21 comprised of copper or aluminum is deposited to fill via and trench openings. After a planarization step, the completed damascene structure appears as illustrated in FIG. 1c.

In a damascene patterning process described in U.S. Pat. No. 6,319,809, a UV radiation step is used to treat the trench and via openings. This treatment reduces the amount of photoresist poisoning that occurs due to diffusion of trace amounts of amines from the dielectric layers. However, this method cannot completely eliminate photoresist poisoning that is depicted in FIG. 2. In FIG. 2, a chemically amplified resist 23 is coated to fill a via hole and form a layer on the damascene structure. However, poisoning from one or more layers 12, 13, 14, 15, or 16 has inhibited the chemical reaction initiated by exposure in region 21. As a result, only the top portion of photoresist 23 in region 21 has been converted to a soluble material that is washed away in developer. A rework process is required to strip the photoresist 23 and repeat the coating and imaging steps. An improved method is needed that totally avoids contamination of the photoresist from dielectrics or from other layers such as nitrides that may be employed as passivation layers in the damascene process.

Another defect that occurs in damascene patterning is depicted in FIG. 3. Photoresist 25 has been exposed and developed to form via hole 24. However, the action of the developer has been restricted somewhat such that some photoresist residue 26 remains in corners of via hole 24. This behavior is possible with all types of photoresist and causes additional processing and costly rework before a clean via 24 can be achieved and metal deposition can proceed. Therefore, it is desirable to implement a method that does not involve coating photoresist in via holes.

It would also be desirable to separate the imaging component from the etch resistant characteristic of the silicon containing layer in the bilayer scheme. Ideally, an improved method should be compatible with a low cost, high throughput manufacturing process and should be applicable to a variety of exposing wavelengths, especially those that are preferred for forming feature sizes below 250 nm. Preferably, the method should be readily implemented into manufacturing so that lengthy times required to qualify new materials can be avoided.

SUMMARY OF THE INVENTION

An objective of the present invention is to provide an improved method of forming damascene structures by optimizing the photoresist patterning process so that it is resistant to poisoning from adjacent layers and does not form scum or residue in via holes during trench patterning.

A further objective of the present invention is to separate the photosensitive component in the patterning process from the silicon containing layer that provides high etch selectivity for pattern transfer.

A still further objective of the present invention is to provide a lithography method that is compatible with a wide variety of exposure tools that are currently available in manufacturing such as g-line (436 nm), i-line (365 nm), Deep UV (248 nm), and ArF (193 nm) steppers and scanners. The method should also be extendable to the next generation of sub-200 nm exposure systems.

A still further objective of the present invention is to provide a photoresist patterning method that is compatible with a high throughput, low cost manufacturing process.

These objectives are achieved by modifying the traditional bilayer approach and removing the requirement that the top layer is both photosensitive and silicon containing. This method is especially useful for the trench patterning step following a process that has formed via holes. In one embodiment, a resin layer is coated on a damascene stack on a substrate consisting of at least one passivation layer, at least one dielectric layer, and one or more via holes formed in the stack. The resin layer is etched back until it is coplanar with the top layer of the damascene stack and fills only the via holes. Next an organic underlayer material such as a Novolak resin, an i-line photoresist or a commercially available underlayer composition is coated on the substrate and baked to form a planar layer. A silicon containing spin-on material that is not photosensitive such as $SiO_2$ is then coated on the underlayer. This layer contains enough silicon to provide a high oxygen etch selectivity for transferring a pattern through the thick underlayer. An optional anti-reflective coating (ARC) is then formed on the silicon layer. A top layer is coated which is a state of the art photoresist that is commercially available and provides the minimum CD for the trench opening. The underlayer and resin plug protect the photoresist from poisoning that causes scum.

After a pattern which contains a trench opening is formed in the top photoresist layer, the pattern is transferred through the ARC and the silicon containing layer with a plasma etch. The etch gas is switched to oxygen and the pattern is then transferred through the thick organic underlayer and part way through the resin layer in the via holes. The etch gas is then switched again to selectively remove dielectric layer exposed by the trench opening. The dielectric layer is lowered to a level that is coplanar with the resin material in the via holes. The remaining resin in the vias is removed by an etch and the remaining underlayer is stripped. Then a metal such as copper is deposited in the trench and vias. A planarizing step such as a chemical mechanical polish lowers the metal until it is coplanar with the dielectric layer.

In a second embodiment, the ARC is omitted and the silicon containing layer may also be modified to contain a dye to control reflectivity during patterning of the top photoresist layer. The refractive indices of the silicon layer are adjusted to optimize the photoresist imaging process such that a foot is not formed on the photoresist sidewalls and no residue or scum occurs in exposed regions.

In a third embodiment, the thick organic underlayer fills the via holes in the damascene structure and also forms a planar layer upon which the silicon containing layer is formed. The ARC is optional and the top layer is a mature, state of the art photoresist that has good process latitude and achieves minimum feature size for a particular exposure wavelength. The process flow is similar to the first embodiment except that the silicon layer is an etch mask while the entire thickness of underlayer exposed by the photoresist pattern is removed including underlayer in via holes. The trench is then formed with another etch step. The remaining silicon containing layer and underlayer are stripped and metal is deposited to complete the damascene structure.

BRIEF DESCRIPTION OF THE DRAWINGS

FIGS. 1a–1c are cross-sectional views depicting a prior art method of forming a dual damascene structure.

FIG. 2 is a cross-sectional view illustrating the effect of poisoning on photoresist patterning during formation of a dual damascene structure.

FIG. 3 is a cross-sectional view showing a scum defect after patterning a photoresist during formation of a dual damascene structure according to a prior art method.

FIGS. 4a–4g are cross-sectional views of a method of forming a dual damascene structure according to an embodiment of the present invention.

DETAILED DESCRIPTION OF THE INVENTION

Figure 4B:
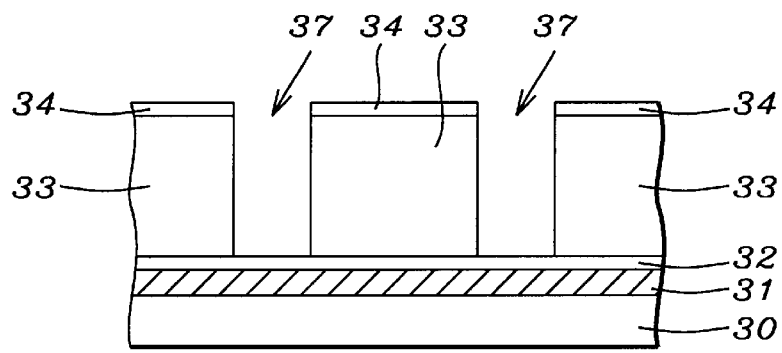

The present invention is particularly useful for photoresist patterning and transferring the pattern into damascene structures. While specific structures are described in the embodiments, those skilled in the art will recognize that the concepts presented can be applied to a variety of applications in manufacturing integrated circuits and electronic devices.

FIGS. 4a–4g demonstrate an improved method of dual damascene formation according to the first embodiment of the present invention. A substrate 30 that is typically silicon is provided with a metal layer 31 selected from a group including copper and aluminum that is generally contained within a dielectric layer (not shown). Substrate 30 usually includes active and passive devices and other metal and insulating layers in a substructure (not shown). Next an etch stop layer 32 is deposited by a technique such as chemical vapor deposition (CVD). Layer 32 can be a material such as silicon nitride, silicon oxynitride or silicon carbide. Next a dielectric layer 33 such as $SiO_2$, carbon doped $SiO_2$, polyarylether, polysilsesquioxane, polyimide, and fluorosilicate glass is deposited by a CVD or spin-on method. Optionally, a passivation layer 34 such as silicon nitride or silicon oxynitride is deposited by a CVD method on dielectric layer 33. A photoresist layer 35 is coated on passivation layer 34 and patterned to form openings 36.

Referring to FIG. 4b, openings 36 are etch transferred through passivation layer 34 and through dielectric layer 33 to form via holes 37. Photoresist 35 is then stripped by a conventional method. A resin solution comprised of an organic polymer in organic solvent is coated and baked to fill vias 37 and form a film on dielectric layer 33. Resin layer 38 can be a material like Novolak resin and is preferably cured at a temperature above 225° C. to remove solvent and prevent outgassing during processing of overlying layers. The curing temperature may also crosslink resin layer 38 so that it does not mix with a layer that is coated on it. Next resin layer 38 is etched back to a level that is coplanar with dielectric layer 33 so that it only fills via holes 37. Resin layer 38 is a key feature since it is an inert plug to materials in adjoining layers 32 and 33 and prevents basic materials like amines that can diffuse out of layers 32 and 33 from reaching an overlying photoresist layer.

An organic underlayer 40 is then formed on the surface of dielectric layer 34 and on resin layer 38. The underlayer 40 is preferably a commercially available composition and may be comprised of the same polymer as in resin layer 38. Underlayer 40 is usually processed at temperatures up to about 225° C. to cure the film and remove all solvent and forms a thickness in the range of about 5000 to about 15000 Angstroms. The polymer in underlayer 40 preferably becomes crosslinked at the curing temperature in order to make it immiscible with organic solutions that are coated on it.

A silicon containing layer 42 is then formed on underlayer 40 by spin coating and baking. The preferred thickness of layer 42 is in a range of about 500 Angstroms to about 5000 Angstroms. Silicon containing layer 42 preferably has a silicon content that provides a high oxygen etch selectivity with respect to the underlayer 40. Silicon containing layer 42 is selected from a group including spin-on $SiO_2$ such as DUO 193 from Honeywell, spin-on silicon nitride, and spin-on silicon oxynitride. Optionally, layer 42 can be comprised of a silicon polymer that is used to formulate silicon containing photoresists. However, the resulting layer 42 should have a high Tg, preferably above 200° C., and should not contain any thermally labile groups that might outgas silicon components during processing of overlying layers. Layer 42 which is not photosensitive is a key feature since prior art examples of silicon containing layers in a patterning scheme typically rely on the silicon layer for both photosensitivity and etch resistance. Here the etch resistance and thermal properties of layer 42 can be optimized without compromising lithographic qualities.

Figure 4C:
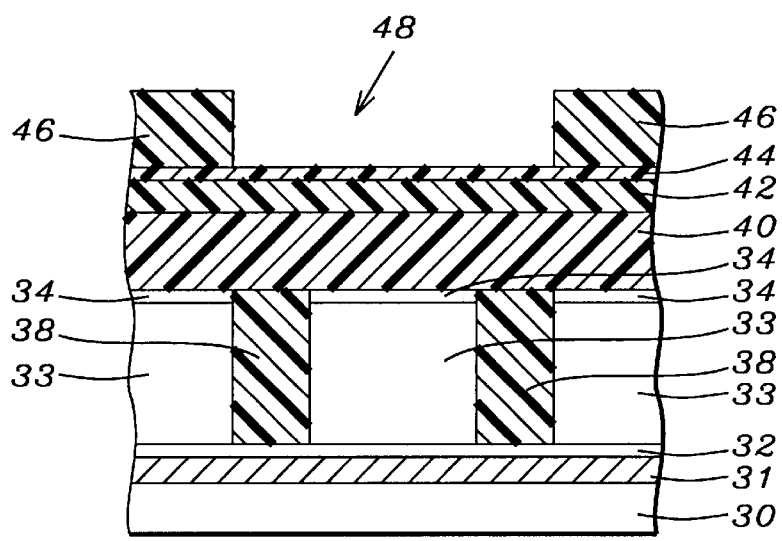

In FIG. 4c, an anti-reflective coating (ARC) 44 with a thickness of about 300 to 1000 Angstroms is formed on silicon layer 42. ARC 44 is usually baked at a temperature up to about 225° C. to cause a thermally induced crosslinking reaction to cure the film and render it impervious to photoresist solutions that are spin coated on it. A commercially available photoresist composition is coated on ARC 44 and baked to give a photoresist layer 46 with a thickness in the range from about 2000 to about 10000 Angstroms. Photoresist 46 is patterned with one or more exposure wavelengths selected from a range of about 10 nm to about 600 nm that provide the desired feature size or opening 48. As the size of the opening shrinks for more advanced technologies, the wavelength of exposing light is reduced. A mature, state of the art photoresist can be employed that is not poisoned during the imaging process because of inert plug 38 and silicon containing layer 42 act as chemical barriers to any amines that might diffuse out of dielectric layer 33 and etch stop layer 32. An ARC 44 is commercially available for each exposure wavelength or a short range of wavelengths and is matched with photoresist 46 to provide straight sidewalls in patterned layer 46 with vertical profiles. ARC 44 is highly absorbing of the exposing wavelength and minimizes reflectivity off layer 42 to help keep feature size 48 within a tight tolerance range.

Figure 4D:
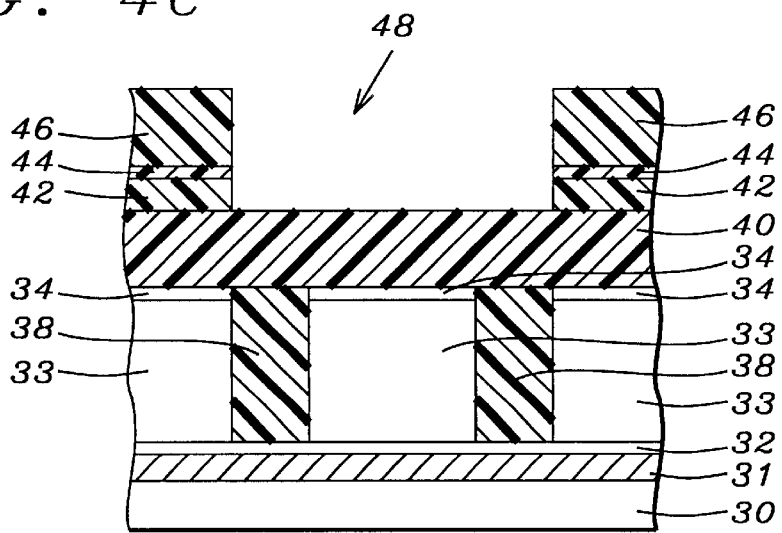

As shown in FIG. 4d, opening 48 is anisotropically etch transferred through ARC 44 and through silicon layer 42 preferably in the same etch chamber with one etch step. The etch recipe involves oxygen and a fluorine containing gas or hydrogen and a fluorine containing gas.

Figure 4E:
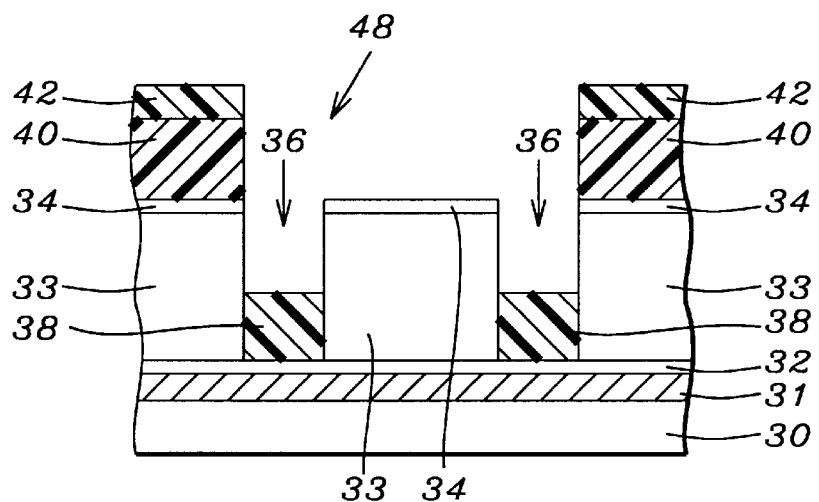

Referring to FIG. 4e, the substrate is subjected to an etch in an oxygen containing plasma or with a $H_2$ and $N_2$ containing plasma gas which consumes layers 44 and 46 and selectively removes underlayer 40 that has been exposed by opening 48. Silicon containing layer 42 is highly resistant to oxygen etch and provides an excellent mask for pattern transfer through underlayer 40 and part way through resin layer 38 in via 37.

Figure 4F:
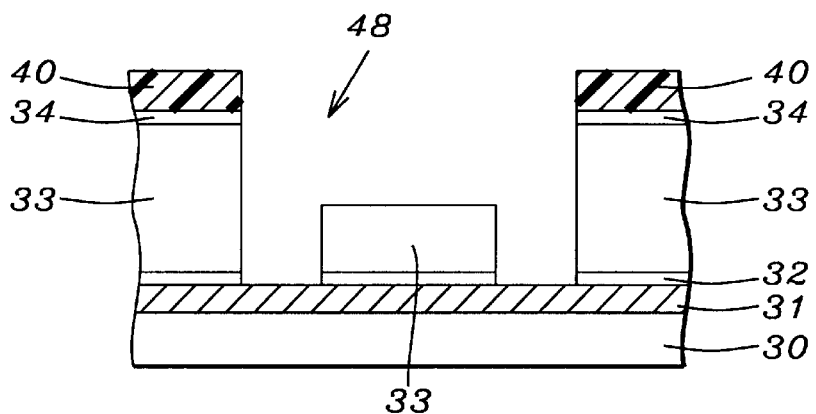
Figure 4G:
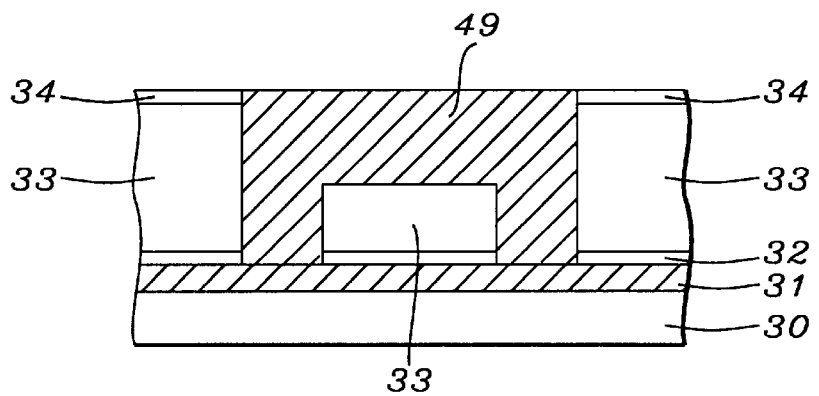

Dielectric layer 33 that is exposed by opening 48 is partially removed by a plasma etch which generally includes a fluorocarbon gas to form the trench opening 48 in FIG. 4f. Resin layer 38 in via holes 37 is now coplanar with dielectric layer 33 in trench opening 48. The final steps are to remove resin layer 38 in via holes 37 and underlayer 40 by an ashing process and to remove exposed etch stop layer 32 by an etch. Optionally a barrier metal layer is deposited to provide a liner in trench 48 and via holes 37. Then a metal 49 such as copper or aluminum is deposited on the substrate to a level above dielectric layer 33. A planarization step such as chemical mechanical polishing then lowers metal 49 to a level that is coplanar with dielectric layer 33 as shown in FIG. 4g.

A second embodiment is illustrated in FIGS. 5a–5e. A substrate 50 that is typically silicon is provided with a metal layer 51 selected from a group including copper and aluminum that is generally contained within a dielectric layer (not shown). Substrate 50 usually includes active and passive devices and other metal and insulating layers in a substructure (not shown). Next an etch stop layer 52 is deposited by a technique such as chemical vapor deposition (CVD). Layer 52 can be a material such as silicon nitride, silicon oxynitride or silicon carbide. Next a dielectric layer 53 such as $SiO_2$, carbon doped $SiO_2$, polyarylether, polysilsesquioxane, polyimide, and fluorosilicate glass is deposited by a CVD or spin-on method. Optionally, a passivation layer 54 comprised of a material such as silicon nitride, silicon oxynitride, or silicon carbide is formed on layer 53. An opening 55 is formed in dielectric layer 53 and in passivation layer 54 by a conventional method that typically involves coating and patterning a photoresist layer (not shown) and using the photoresist pattern as a mask to etch transfer the opening 55 into dielectric layer 53.

After the patterned photoresist is stripped, a resin solution comprised of an organic polymer in organic solvent is coated and baked to fill via openings 55 and form a resin layer 58 on passivation layer 54. Resin layer 58 can be a material like Novolak resin and is preferably cured at a temperature about 225° C. or higher to remove solvent and prevent outgassing during processing of overlying layers. The curing temperature may also crosslink resin layer 58 so that it does not mix with a layer that is coated on it. Next resin layer 58 is etched back to a level that is coplanar with passivation layer 54 so that it only fills via holes 55. Resin layer 58 is a key feature since it is an inert plug to materials in adjoining layers 52 and 53 and prevents basic materials like amines that can diffuse out of layers 52 and 53 from reaching an overlying photoresist layer.

An organic underlayer 56 is then formed on the surface of passivation layer 54 and on resin layer 58. The underlayer 56 is preferably a commercially available composition and may be comprised of the same polymer as in resin layer 58. Underlayer 56 is usually processed at temperatures up to about 225° C. to cure the film and remove all solvent and forms a thickness in the range of about 5000 to about 15000 Angstroms. The polymer in underlayer 56 preferably becomes crosslinked at the curing temperature in order to make it immiscible with organic solutions that are coated on it.

A silicon containing layer 57 is then formed on underlayer 56 by spin coating and baking. The preferred thickness of layer 57 is in a range of about 500 Angstroms to about 5000 Angstroms. Silicon containing layer 57 preferably has a silicon content that provides a high oxygen etch selectivity with respect to the underlayer 58. In this case, layer 57 includes a dye additive that increases its absorbance of the exposing wavelength during patterning of an overlying photoresist layer. This anti-reflective property enables the ARC in the first embodiment to be omitted in the second embodiment. Silicon containing layer 57 is selected from a group including spin-on $SiO_2$, spin-on silicon nitride, and spin-on silicon oxynitride. Optionally, layer 57 can be comprised of a silicon polymer that is used to formulate silicon containing photoresists. However, the resulting layer 57 should have a high Tg, preferably above 200° C., and should not contain any thermally labile groups that might outgas silicon components during processing of overlying layers. Layer 57 which is not photosensitive is a key feature since prior art examples of silicon containing layers in a patterning scheme typically rely on the silicon layer for both photosensitivity and etch resistance.

Figure 5A:
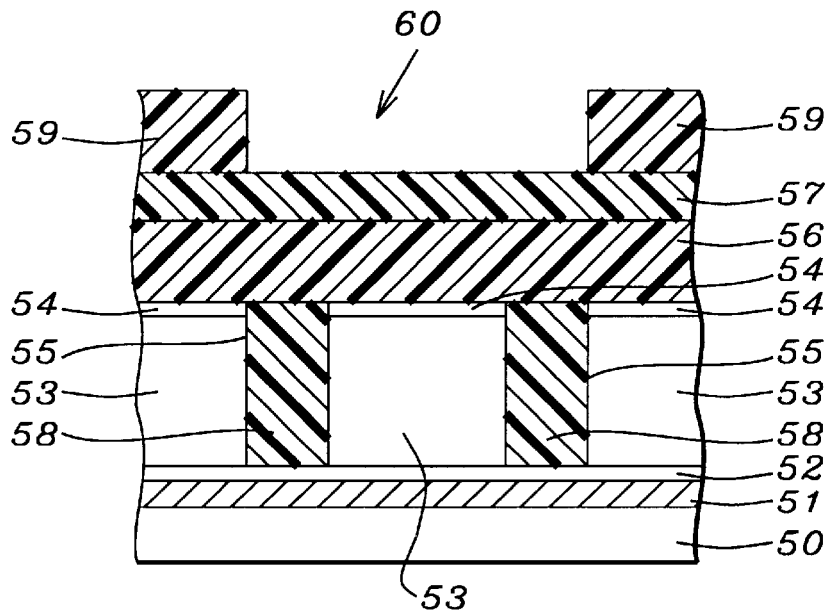
FIGS. 5a–5e are cross-sectional views of a method of forming a dual damascene structure according to a second embodiment of the present invention.

In FIG. 5a, a commercially available photoresist composition is coated on resin layer 57 and baked to give a photoresist layer 59 with a thickness in the range from about 2000 to about 10000 Angstroms. Photoresist 59 is patterned with one or more exposure wavelengths selected from a range of about 10 nm to about 600 nm that provide the desired feature size or opening 60. As the size of the opening shrinks for more advanced technologies, the wavelength of exposing light is reduced. A mature, state of the art photoresist can be employed that is not poisoned during the imaging process because of inert plug 58 and silicon containing layer 57 act as chemical barriers to any amines that might diffuse out of dielectric layer 53 and passivation layer 54. The refractive indices (n and k) of silicon containing layer 57 can be adjusted to be compatible with photoresist 59 such that a vertical profile with 90° sidewalls and no residue is formed in exposed and developed regions 60

Figure 5B:
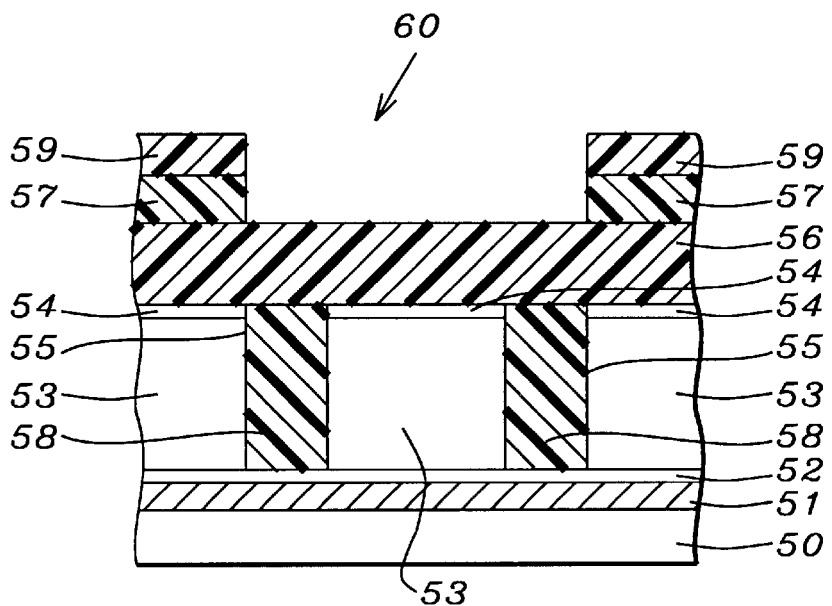
Figure 5C:
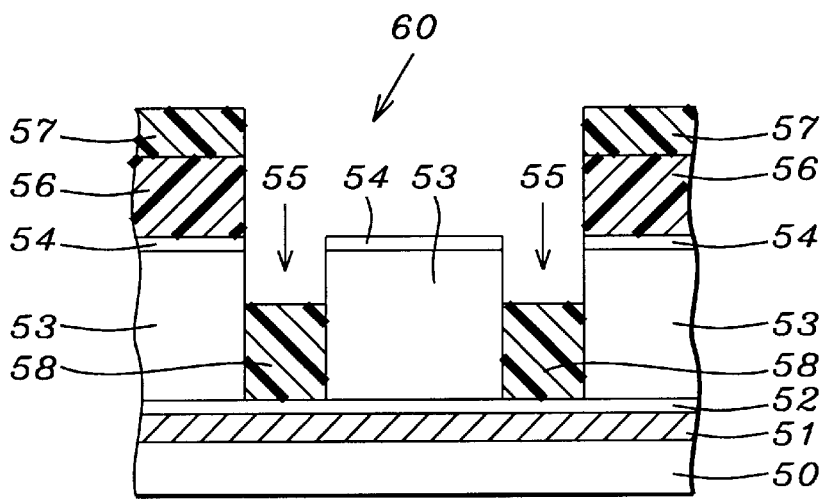

Opening 60 in photoresist layer 59 is etch transferred through silicon layer 57 using an etch comprised of $O_2$ and a fluorine containing plasma or with a $H_2$ and fluorine containing plasma to form a structure shown in FIG. 5b. The etch gas is switched to oxygen and underlayer 56 is selectively removed where it is exposed by opening 60. Silicon containing layer 57 provides an excellent mask for pattern transfer with an oxygen plasma or with a $H_2/N_2$ plasma through underlayer 56 and part way through resin layer 58 in via 55 as depicted in FIG. 5c.

Figure 5D:
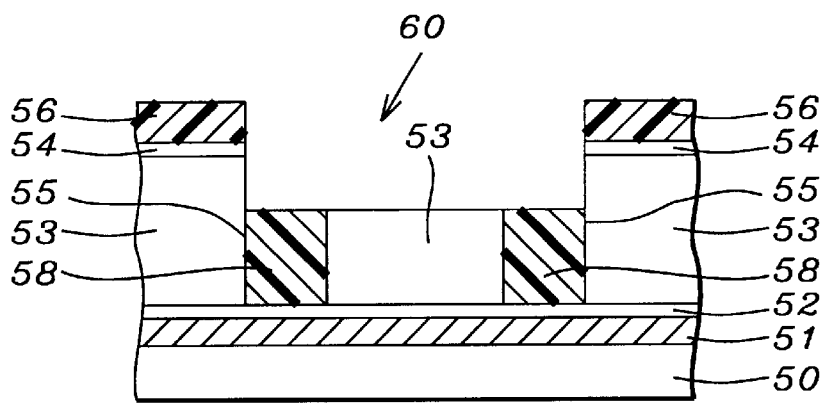

Referring to FIG. 5d, the etch gas is changed for the next etch step in which passivation layer 54 that has been exposed by opening 60 is removed and dielectric layer 53 exposed by opening 60 is partially removed. Resin layer 58 in via holes 55 is now coplanar with dielectric layer 53 in trench opening 60.

Figure 5E:
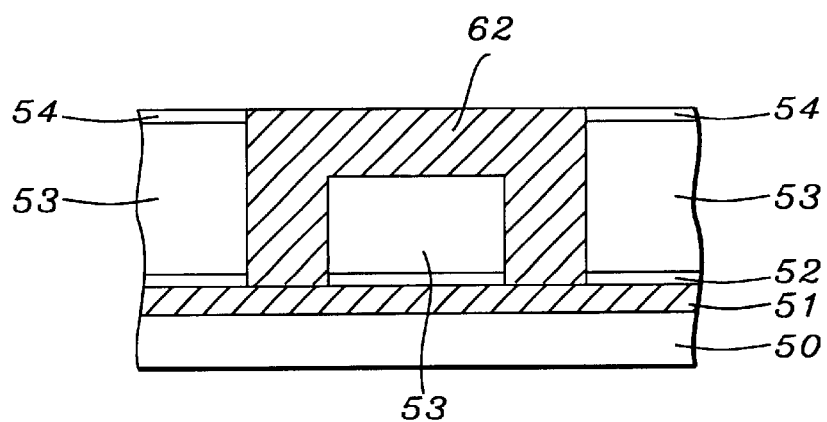

The final steps are to remove resin layer 58 in via holes 55, silicon layer 57, underlayer 56, and etch stop 52 exposed at the bottom of via holes 55. Optionally, a barrier metal layer (not shown) such as TiN is deposited in via holes 55 and in trench 60 to form a liner. Then a metal 62 selected from a group including copper and aluminum is deposited on the substrate to a level above passivation layer 54. A planarization step such as chemical mechanical polishing lowers metal layer 62 to a level that is coplanar with the top of layer 54 as shown in FIG. 5e.

In a third embodiment that is shown in FIGS. 6a–6e, a substrate 70 that is typically silicon is provided with a metal layer 71 selected from a group including copper and aluminum that is generally contained within a dielectric layer (not shown). Substrate 70 usually includes active and passive devices and other metal and insulating layers in a substructure (not shown). Next an etch stop layer 72 is deposited by a technique such as chemical vapor deposition (CVD). Layer 72 can be a material such as silicon nitride, silicon oxynitride or silicon carbide. Next a dielectric layer 74 such as $SiO_2$, carbon doped $SiO_2$, polyarylether, polysilsesquioxane, polyimide, fluorosilicate glass, and other low k dielectric materials is deposited by a CVD or spin-on method. Optionally, a passivation layer 76 comprised of a material such as silicon nitride, silicon oxynitride, or silicon carbide is formed on layer 74. An opening 77 is formed in dielectric layer 74 and in passivation layer 76 by a conventional method that typically involves coating and patterning a photoresist layer (not shown) and using the photoresist pattern as a mask to etch transfer the opening 77 into dielectric layer 74.

After the patterned photoresist is stripped, a resin solution comprised of an organic polymer in organic solvent is coated and baked to fill via openings 77 and form a resin layer 80 on passivation layer 76. Underlayer 80 is coated to a thickness of between 5000 Angstroms and 15000 Angstroms above layer 76. Resin layer 80 can be a material like Novolak resin and is preferably cured at a temperature about 225° C. or higher to remove solvent and prevent outgassing during processing of overlying layers. The curing temperature may also crosslink resin layer 80 so that it does not mix with a layer that is coated on it. Resin layer 80 is a key feature since it is an inert plug to materials in adjoining layers 72 and 74 and prevents basic materials like amines that can diffuse out of layers 74 and 76 from reaching an overlying photoresist layer.

A silicon containing layer 82 is then formed on underlayer 80 by spin coating and baking. The preferred thickness of layer 82 is in a range of about 500 Angstroms to about 5000 Angstroms. Silicon containing layer 82 preferably has a silicon content that provides a high oxygen etch selectivity with respect to the resin layer 80. Silicon containing layer 82 is selected from a group including spin-on $SiO_2$ such as DUO 193 from Honeywell, spin-on silicon nitride, and spin-on silicon oxynitride. Optionally, layer 82 can be comprised of a silicon polymer that is used to formulate silicon containing photoresists. However, the resulting layer 82 should have a high Tg, preferably above 200° C., and should not contain any thermally labile groups that might outgas silicon components during processing of overlying layers. Layer 82 which is not photosensitive is a key feature since prior art examples of silicon containing layers in a patterning scheme typically rely on the silicon layer for both photosensitivity and etch resistance. Here the etch resistance and thermal properties of layer 82 can be optimized without compromising lithographic qualities.

Figure 6A:
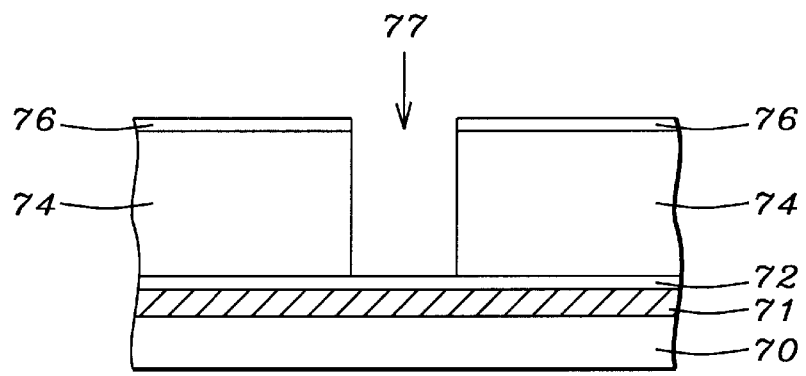
FIGS. 6a–6e are cross-sectional views of a method of forming a dual damascene structure according to a third embodiment of the present invention.
Figure 6B:
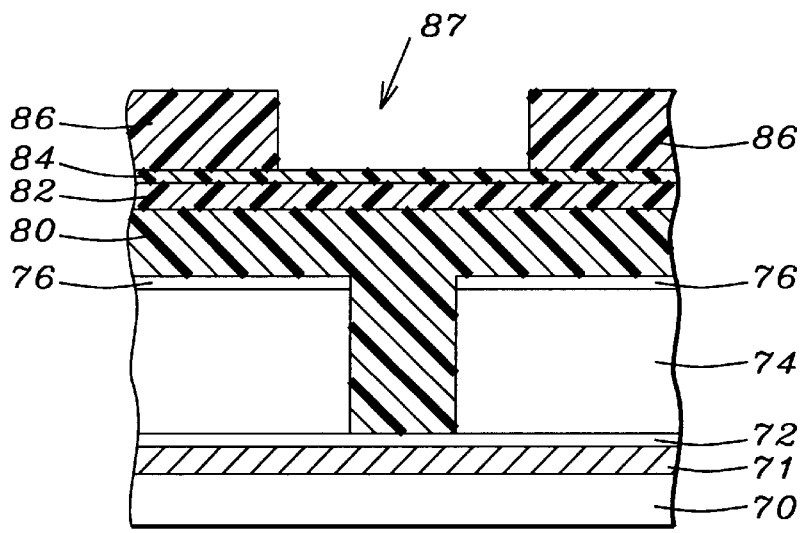

In FIG. 6b, an anti-reflective coating (ARC) 84 with a thickness of about 300 to 1000 Angstroms is formed on silicon layer 82. ARC 84 is usually baked at a temperature up to about 225° C. to cause a thermally induced crosslinking reaction to cure the film and render it impervious to photoresist solutions that are spin coated on it. A commercially available photoresist composition is coated on ARC 84 and baked to give a photoresist layer 86 with a thickness in the range from about 2000 to about 10000 Angstroms. Photoresist 86 is patterned with one or more exposure wavelengths selected from a range of about 10 nm to about 600 nm that provide the desired feature size or opening 87. As the size of the opening shrinks for more advanced technologies, the wavelength of exposing light is reduced. A mature, state of the art photoresist can be employed that is not poisoned during the imaging process because resin layer 80 and silicon containing layer 82 act as chemical barriers to any amines that might diffuse out of dielectric layer 74 and passivation layer 76. An ARC 84 is commercially available for each exposure wavelength or a short range of wavelengths and is matched with photoresist 86 to provide straight sidewalls in patterned layer 86 with vertical profiles. ARC 84 is highly absorbing of the exposing wavelength and minimizes reflectivity off layer 82 to help keep feature size 87 within a tight tolerance range.

Figure 6C:
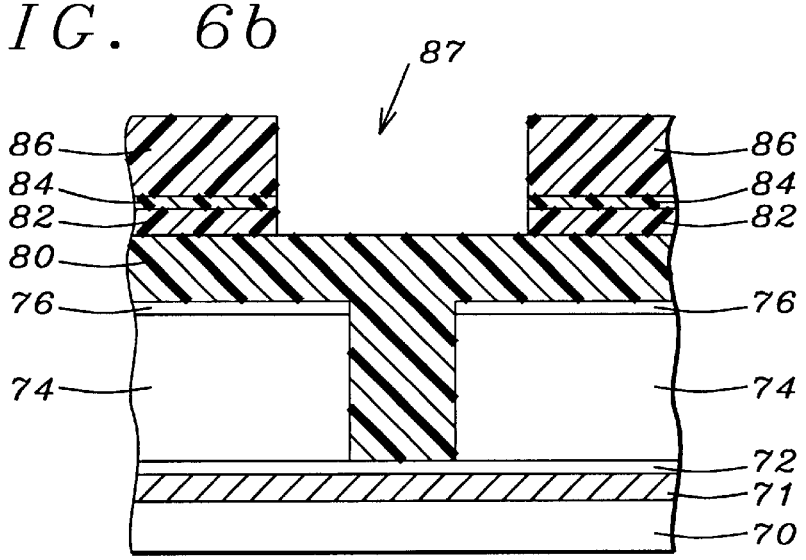

As shown in FIG. 6c, opening 87 is anisotropically etch transferred through ARC 84 and through silicon layer 82 preferably in the same etch chamber with one etch step. The etch recipe involves oxygen and a fluorine containing gas or hydrogen and a fluorine containing gas.

Figure 6D:
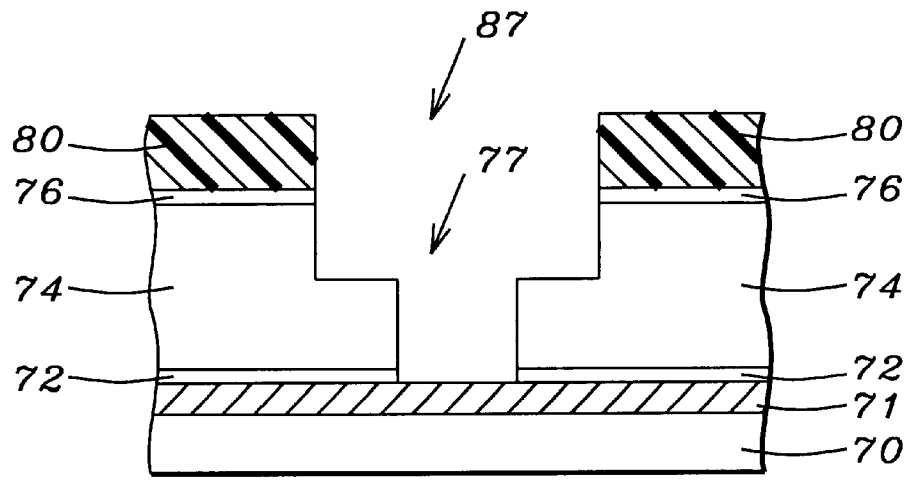

Referring to FIG. 6d, the substrate is subjected to an etch in an oxygen containing plasma or with a $H_2$ and $N_2$ containing plasma gas which consumes layers 84 and 86 and selectively removes resin layer 80 that has been exposed by opening 87. Silicon containing layer 82 is highly resistant to oxygen etch and provides an excellent mask for pattern transfer through resin layer 80 above passivation layer 74 and part way through resin layer 80 in via 77.

A second etch step is performed to remove passivation layer 76 and dielectric layer 74 in regions that are exposed by opening 87. The etch through dielectric layer 74 continues until the level of layer 74 is about coplanar with the resin layer 80 remaining in vias 77. The resin layer 80 has a slow etch rate during the dielectric layer 74 etch and remains at about the same level as after the previous pattern transfer etch step. Preferably, silicon containing layer 84 is removed during the etch through dielectric layer 74. As a result, trench opening 87 and via opening 77 are formed as shown in FIG. 6d.

Figure 6E:
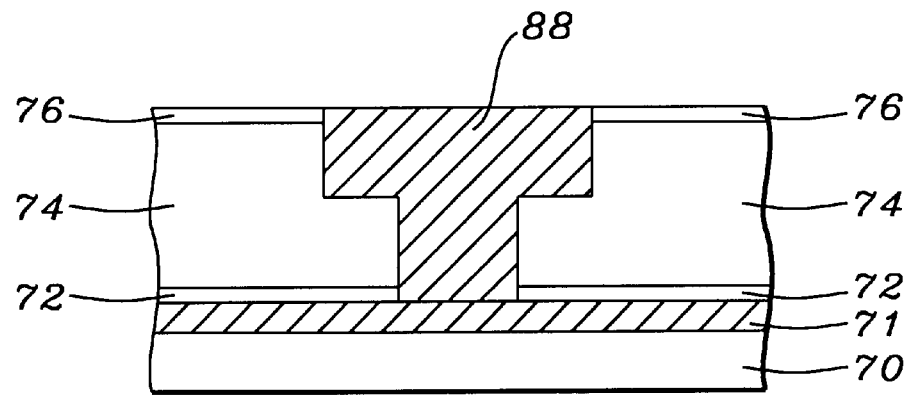

The final steps are to remove resin layer 80 above passivation layer 76 and in via holes 77 by an ashing process. Optionally a barrier metal layer (not shown) is deposited to provide a liner in trench 87 and in via holes 77. Then a metal 88 such as copper or aluminum is deposited on the substrate to a level above passivation layer 76. A planarization step such as chemical mechanical polishing then lowers metal 88 to a level that is coplanar with passivation layer 76 as shown in FIG. 6e.

All three embodiments provide an improved method of forming a dual damascene structure. The inert resin or underlayer that fills a via hole prevents any materials that diffuse out of passivation, dielectric or etch stop layers from reaching the overlying photoresist layer and poisoning the chemical reaction needed to form a pattern. Moreover, the need to coat a photoresist layer in a via hole is eliminated and a scumming problem as shown in FIG. 3 is avoided. The method is an advantage over traditional bilayer schemes because the imaging requirement has been removed from the silicon containing layer. Thus, the high oxygen etch selectivity of the silicon containing layer is retained and improved imaging performance is available from mature photoresists that have a wider process latitude and better uniformity of printed feature size across the substrate. Since mature photoresists without silicon are normally available much earlier than optimized silicon containing resists for a particular exposing wavelength, the method of the present invention can be implemented sooner into manufacturing than a traditional bilayer scheme. The method is versatile and is effective for all exposing wavelengths including 157 nm and 193 nm that are planned for newer technologies. Therefore, the resin layer, underlayer and Si-containing layers do not have to be changed as each new technology with a different exposure wavelength is introduced into manufacturing. A low cost, high throughput process is achieved because existing exposure and etch tools are employed. In addition, expensive rework to correct poisoning or scum defects is avoided. The silicon containing polymer is less expensive than a silicon containing resist since the photosensitivity specification which is difficult and costly to control is avoided.

In the absence of a photosensitivity requirement, the silicon containing layer can be easily tuned to satisfy the desired thermal and optical properties needed for a successful damascene process. Moreover, the outgassing concern associated with silicon containing photoresists has been eliminated since there is no chemical reaction that occurs in the silicon containing layer which can form small silicon containing fragments that can diffuse out of the film. The silicon containing layer is also thermally stable so that silicon containing fragments are not formed by a thermal process.

While this invention has been particularly shown and described with reference to, the preferred embodiments thereof, it will be understood by those skilled in the art that various changes in form and details may be made without departing from the spirit and scope of this invention.

We claim:

1. A dual damascene method, comprising:
   (a) providing a substrate with a first stack of layers formed thereon, said first stack comprising a bottom etch stop layer and a top dielectric layer;
   (b) forming a via hole in said dielectric layer;
   (c) filling said via hole with a resin layer;
   (d) forming a second stack of layers upon first said stack, said second stack is formed by sequentially coating an underlayer, a silicon containing layer, an anti-reflective coating (ARC), and a photoresist;
   (e) forming a trench pattern in said photoresist and etch transferring said pattern into said dielectric layer;
   (f) removing the resin layer in said via hole and remaining layers in said second stack;
   (g) removing said etch stop layer that is exposed at the bottom of said via; and
   (h) depositing a metal and planarizing to form a metal surface that is coplanar with the top of said first stack.

2. The method of claim 1 further comprised of forming a passivation layer on said dielectric layer prior to forming said via hole.

3. The method of claim 1 wherein said dielectric layer is selected from a group of materials including $SiO_2$, carbon doped $SiO_2$, polyarylethers, polysilsesquioxanes, polyimides, fluorosilicate glass, and other low k dielectric materials.

4. The method of claim 1 wherein said resin is selected from a group of materials including Novolak resin and photoresists comprising Novolak resin.

5. The method of claim 4 wherein said resin layer is cured to a temperature of about 225° C. or higher to render it inert toward subsequent coating processes.

6. The method of claim 1 further comprised of etching back the coated resin layer to a level that is about coplanar with the top of said via hole before forming a second stack.

7. The method of claim 1 wherein said underlayer is cured at a temperature of about 225° C. and forms a thickness between about 3000 Angstroms and 15000 Angstroms.

8. The method of claim 7 wherein said underlayer is comprised of the same material as said resin layer.

9. The method of claim 1 wherein said silicon containing layer is comprised of a spin-on material with a thickness in the range of about 500 to about 5000 Angstroms.

10. The method of claim 1 wherein said silicon containing layer is stable to thermal treatments such that no chemical reaction or outgassing occurs in said layer during processing of overlying layers.

11. The method of claim 1 wherein the silicon containing layer has a silicon content that provides a high etch selectivity relative to said underlayer and said resin layer.

12. The method of claim 1 wherein the ARC and photoresist are a matched pair of materials for patterning with one or more exposure wavelengths that are selected from a range of about 10 nm to about 600 nm.

13. The method of claim 1 wherein the trench opening is aligned above two via holes.

14. The method of claim 1 further comprised of forming a barrier metal layer in the via hole and trench prior to depositing said metal layer.

15. The method of claim 1 wherein said metal layer is comprised of copper.

16. A dual damascene method, comprising:
   (a) providing a substrate with a first stack of layers formed thereon, said first stack comprising a bottom etch stop layer and a top dielectric layer;
   (b) forming a via hole in said dielectric layer;
   (c) filling said via hole with a resin layer;
   (d) forming a second stack of layers upon first said stack, said second stack is formed by sequentially coating an underlayer, a silicon containing layer, and a photoresist;
   (e) forming a trench pattern in said photoresist and etch transferring said pattern into said dielectric layer;
   (f) removing the resin layer in said via hole and remaining layers in said second stack;
   (g) removing said etch stop layer at the bottom of said via hole; and
   (h) depositing a metal and planarizing to form a metal surface that is coplanar with the top of said first stack.

17. The method of claim 16 further comprised of forming a passivation layer on said dielectric layer prior to forming said via hole.

18. The method of claim 16 wherein said dielectric layer is selected from a group of materials including $SiO_2$, carbon doped $SiO_2$, polyarylethers, polysilsesquioxanes, polyimides, fluorosilicate glass, and other low k dielectric materials.

19. The method of claim 16 wherein said resin is selected from a group of materials including Novolak resin and photoresists comprising Novolak resin.

20. The method of claim 16 wherein said resin layer is cured to a temperature of about 225° C. or higher to render it inert toward subsequent coating processes.

21. The method of claim 16 further comprised of etching back the coated resin layer to a level that is about coplanar with the top of said via hole before forming a second stack.

22. The method of claim 16 wherein said underlayer is cured at a temperature of about 225° C. and forms a thickness between about 3000 Angstroms and 15000 Angstroms.

23. The method of claim 22 wherein said underlayer is comprised of the same material as said resin layer.

24. The method of claim 16 wherein said silicon containing layer is comprised of a spin-on material with a thickness in the range of about 500 to about 5000 Angstroms.

25. The method of claim 24 wherein said silicon containing layer is further comprised of a dye to enable said layer to function as an anti-reflective layer during patterning of said photoresist.

26. The method of claim 25 wherein said silicon containing layer is stable to thermal treatments such that no chemical reaction or outgassing occurs in said layer during processing of overlying layers.

27. The method of claim 16 wherein the silicon containing layer has a silicon content that provides a high etch selectivity relative to said underlayer and said resin layer.

28. The method of claim 16 wherein the photoresist is exposed with one or more wavelengths that are selected from a range of about 10 nm to about 600 nm.

29. The method of claim 16 wherein the trench opening is aligned above two via holes.

30. The method of claim 16 further comprised of forming a barrier metal layer in the via hole and trench prior to depositing said metal layer.

31. The method of claim 16 wherein said metal layer is comprised of copper.

32. A dual damascene method, comprising:
   (a) providing a substrate with a first stack of layers formed thereon, said first stack comprising a bottom etch stop layer and a top dielectric layer;
   (b) forming a via hole in said dielectric layer;
   (c) filling said via hole with a resin that forms a layer on said first stack;
   (d) forming a second stack of layers on said resin layer, said second stack is formed by sequentially coating a silicon containing layer, an ARC, and a photoresist;
   (e) forming a trench pattern in said photoresist and etch transferring said pattern into said dielectric layer;
   (f) removing the resin layer in said via hole and remaining layers in said second stack;
   (g) removing the etch stop layer at the bottom of said via holes; and
   (h) depositing a metal and planarizing to form a metal surface that is coplanar with the top of said first stack.

33. The method of claim 32 further comprised of forming a passivation layer on said dielectric layer before forming said via hole.

34. The method of claim 32 wherein said dielectric layer is selected from a group of materials including $SiO_2$, carbon doped $SiO_2$, polyarylethers, polysilsesquioxanes, polyimides, fluorosilicate glass, and other low k dielectric materials.

35. The method of claim 32 wherein said resin layer is selected from a group of materials including Novolak resin and photoresists comprising Novolak resin.

36. The method of claim 35 wherein said resin layer forms a thickness between about 3000 and 15000 Angstroms above the top of said via hole.

37. The method of claim 32 wherein said resin layer is cured to a temperature of about 225° C. or higher to render it inert toward subsequent coating processes.

38. The method of claim 32 wherein said silicon containing layer is comprised of a spin-on material with a thickness in the range of about 500 to about 5000 Angstroms.

39. The method of claim 32 wherein said silicon containing layer is stable to thermal treatments such that no chemical reaction or outgassing occurs in said layer during processing of overlying layers.

40. The method of claim 32 wherein the silicon containing layer has a silicon content that provides a high etch selectivity relative to said resin layer.

41. The method of claim 32 wherein the ARC and photoresist are a matched pair of materials for patterning with one or more exposure wavelengths that are selected from a range of about 10 nm to about 600 nm.

42. The method of claim 32 further comprised of forming a barrier metal layer in the via hole and trench prior to depositing said metal layer.

43. The method of claim 32 wherein the metal layer is copper.

* * * * *